(12) United States Patent
Moctezuma et al.

(10) Patent No.: US 10,840,809 B2
(45) Date of Patent: Nov. 17, 2020

(54) SWITCHING CONVERTER WITH OUTPUT CURRENT ESTIMATOR CIRCUIT

(71) Applicant: TEXAS INSTRUMENTS INCORPORATED, Dallas, TX (US)

(72) Inventors: Ariel Dario Moctezuma, Richardson, TX (US); Hassan Pooya Forghani-Zadeh, Dallas, TX (US); Srinath Hosur, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 16/428,440

(22) Filed: May 31, 2019

(65) Prior Publication Data

US 2020/0099293 A1 Mar. 26, 2020

Related U.S. Application Data

(60) Provisional application No. 62/736,583, filed on Sep. 26, 2018.

(51) Int. Cl.
*H02M 3/158* (2006.01)
*H03K 5/24* (2006.01)
*H02M 1/00* (2006.01)

(52) U.S. Cl.
CPC .............. *H02M 3/158* (2013.01); *H03K 5/24* (2013.01); *H02M 2001/009* (2013.01); *H02M 2001/0009* (2013.01)

(58) Field of Classification Search
CPC ...... H02M 3/156; H02M 3/157; H02M 3/158; H02M 2001/0009; H02M 2001/009; H03K 5/24
See application file for complete search history.

(56) References Cited

U.S. PATENT DOCUMENTS

| | | | | |
|---|---|---|---|---|
| 2010/0070133 | A1* | 3/2010 | Ishishita | H01M 10/443 701/36 |
| 2011/0019315 | A1* | 1/2011 | Jenkner | H02M 3/157 361/18 |
| 2014/0184114 | A1* | 7/2014 | Omata | H02P 6/08 318/400.02 |
| 2015/0123580 | A1* | 5/2015 | Omata | H02P 29/032 318/400.17 |
| 2020/0088783 | A1* | 3/2020 | Kranz | H02M 1/44 |

* cited by examiner

*Primary Examiner* — Adolf D Berhane
(74) *Attorney, Agent, or Firm* — Michael A. Davis, Jr.; Charles A. Brill; Frank D. Cimino

(57) ABSTRACT

A system includes a switching converter circuit and a monitoring circuit coupled to the switching converter circuit. The monitoring circuit includes a current estimation circuit configured to estimate an output current of the switching converter circuit. The monitoring circuit also includes a compare circuit configured to compare the estimated average output current with a threshold, wherein the compare circuit is configured to output an alert signal in response to the estimated output current being greater than the threshold.

20 Claims, 9 Drawing Sheets

SWITCHING CONVERTER WITH OUTPUT CURRENT ESTIMATOR CIRCUIT

CROSS-REFERENCE TO RELATED APPLICATIONS

This application claims priority to U.S. Provisional Application No. 62/736,583, filed Sep. 26, 2018, which is hereby incorporated by reference.

BACKGROUND

Power supplies and power converters are used in a variety of electronic systems. Electrical power is generally transmitted over long distances as an alternating current (AC) signal. The AC signal is divided and metered as desired for each business or home location, and is often converted to direct current (DC) for use with individual electronic devices or components. Modern electronic systems often employ devices or components designed to operate using different DC voltages. Accordingly, different DC-DC converters, or a DC-DC converter that supports a wide range of output voltages, are needed for such systems.

There are many different DC-DC converter topologies. The available topologies differ with regard to the components used, the amount of power handled, the input voltage(s), the output voltage(s), efficiency, reliability, size and/or other characteristics. One example DC-DC converter topology is a single-input multiple-output (SIMO) converter, which provides multiple outputs by charging and selectively discharging a single inductor to different nodes. In some SIMO converter scenarios, low efficiency and output oscillations may occur due to the components used as well as control issues.

SUMMARY

In accordance with at least one example of the disclosure, a system comprises a switching converter circuit and a monitoring circuit coupled to the switching converter circuit. The monitoring circuit includes a current estimation circuit configured to estimate an output current of the switching converter circuit. The monitoring circuit also includes a compare circuit configured to compare the estimated average output current with a threshold, wherein the compare circuit is configured to output an alert signal in response to the estimated output current being greater than the threshold.

In accordance with at least one example of the disclosure, a converter circuit comprises a first switch coupled between a first inductor node and a voltage supply node. The converter circuit also comprises a second switch coupled between the first inductor node and a negative supply output node. The converter circuit also comprises a third switch coupled between a second inductor node and a positive output supply node. The converter also comprises a fourth switch coupled between the second inductor node and a ground node. The converter circuit also comprises a controller coupled to the first, second, third, and fourth switches. The converter circuit also comprises a monitoring circuit coupled to at least one of the negative supply output node and the positive supply output node, wherein the monitoring circuit comprises a current estimation circuit and a compare circuit coupled to the current estimation circuit.

In accordance with at least one example of the disclosure, a converter device comprises a first switch coupled between a first inductor node and a voltage supply node. The converter device also comprises a second switch coupled between the first inductor node and a negative supply output node. The converter device also comprises a third switch coupled between a second inductor node and a positive output supply node. The converter device also comprises a fourth switch coupled between the second inductor node and a ground node. The converter device also comprises a monitoring circuit coupled to at least one of the negative supply output node and the positive supply output node. The monitoring circuit is configured to estimate an output current and to provide an alert signal in response to the estimated output current being greater than a threshold.

BRIEF DESCRIPTION OF THE DRAWINGS

For a detailed description of various examples, reference will now be made to the accompanying drawings in which.

DETAILED DESCRIPTION

Figure 1:
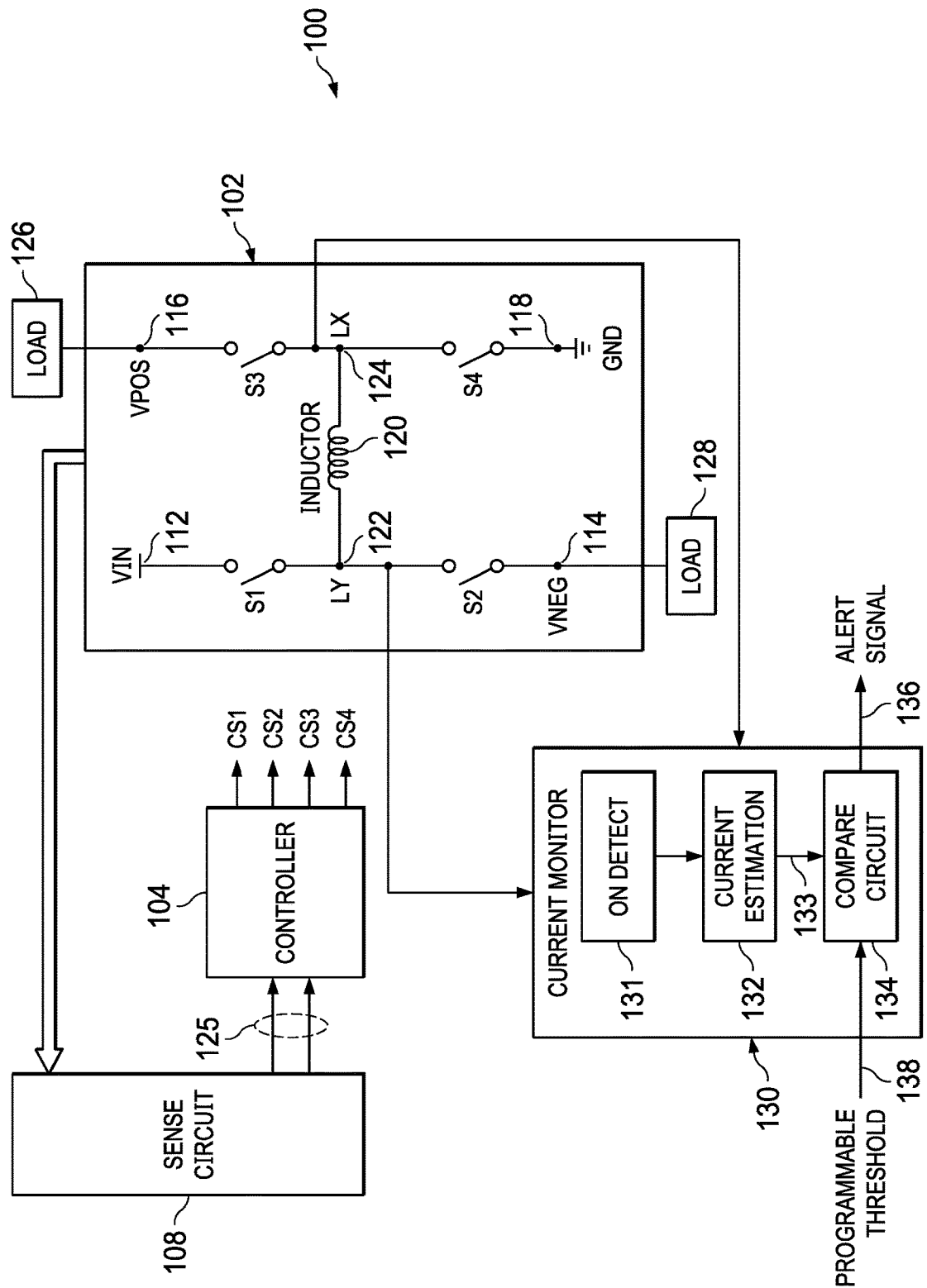
FIG. 1 is a block diagram showing a switching converter system in accordance with various examples.

Disclosed herein are switching converter topologies involving a current monitor circuit configured to estimate an output current for the switching converter. The estimated output current is used, for example, to detect an overcurrent condition (e.g., the current is above a threshold for more than a predetermined interval). In some examples, the current monitor circuit includes a switch "on" (conduction) detection stage, a current estimation stage, and a compare stage. The conduction detection stage detects a high-side switch "on" condition or a low-side switch "on" condition. The current estimation stage provides a scaled estimate of the current associated with the detected switch "on" condition. In some examples, an integration stage is used to integrate the estimated current for a time interval. The compare stage compares a current estimate from the current estimation stage or the integration stage with a reference value. If the current estimate is greater than the reference value, the compare stage outputs an overcurrent signal or alert. If the current estimate is not greater than the reference value, the compare stage does not output an overcurrent signal or alert. Alternatively, the compare stage may output an undercurrent signal in response to the current estimate being equal to or less than the reference value. In some examples, the compare stage avoids outputting a signal in response to the current estimate being equal to or less than the reference value (i.e., the compare stage only outputs a signal in response to an overcurrent condition).

In some examples, the switching converter has a single-input multiple-output (SIMO) converter topology. An example SIMO converter includes an inductor, a first switch between a first end of the inductor and a power supply node, a second switch between the first end of the inductor and a negative output supply node, a third switch coupled between a second end of the inductor and a positive output supply node, and a fourth switch coupled between the second end of the inductor and a ground node. The SIMO converter also includes a controller coupled to the first, second, third, and fourth switches, where controller directs operations of the first, second, third, and fourth switches to transition from a rest state, to at least one boost iteration, and back to a rest state. In some examples, each boost iteration involves performing an inductor charge mode followed by a positive or negative boost mode. As needed, multiple boost iterations are performed before transitioning back to the rest state. In some examples, the current monitor circuit is used to detect and respond to overcurrent conditions in a SIMO converter, where the detection occurs during a switch "on" or forward bias diode condition related to one or more boost iterations. In other examples, the current monitor circuit is used to detect and respond to overcurrent conditions in another switching converter that occur during a switch "on" or forward biased diode condition. To provide a better understanding, various switching converter options and current monitor circuit options are described using the figures as follows.

FIG. 1 is a block diagram showing a switching converter system 100 in accordance with various examples. In FIG. 1, the system 100 represents a consumer product, an integrated circuit or chip, a printed circuit board (PCB) with integrated circuit and/or discrete components, and/or another electrical device. As shown, the system 100 comprises a SIMO converter circuit 102 coupled to a controller 104. The system 100 also comprises a sense circuit 108 coupled to the SIMO converter circuit 102 and to the controller 104. The system 100 also comprises a first load 126 coupled to a positive output supply node 116 of the SIMO converter circuit 102. The system 100 also comprises a second load 128 coupled to a negative output supply node 114 of the SIMO converter circuit 102.

In the example of FIG. 1, the SIMO converter circuit 102 comprises a first switch (S1) coupled between a power supply (VIN) node 112 and a first inductor node (labeled "LY") 122. The SIMO converter circuit 102 also comprises a second switch (S2) coupled between the first inductor node 122 and the negative output supply node 114. The SIMO converter circuit 102 also comprises a third switch (S3) coupled between a second inductor node (labeled "LX") 124 and the positive output supply node 116. The SIMO converter circuit 102 also comprises a fourth switch (S4) coupled between the second inductor node 124 and a ground node 118.

In FIG. 1, an inductor 120 is coupled between the first and second inductor nodes 122 and 124. In some examples, the inductor 120 is a discrete component that is added to the SIMO converter circuit 102 by coupling respective terminals of the inductor 120 to the first and second inductor nodes 122 and 124. In contrast, the other components of the SIMO converter circuit 102 may be part of an integrated circuit. In some examples, the integrated circuit also includes the controller 102 and the sense circuit 108. In other examples, the controller 102 and/or the sense circuit 108 are part of an integrated circuit that is separate from the SIMO converter circuit 102. Also, in some examples, the first and second loads 126 and 128 are separate components or circuits relative to the SIMO converter circuit 102, the controller 104, and the sense circuit 108.

In the example of FIG. 1, the controller 104 supports various modes for the SIMO converter circuit 102 as well as at least one rest state. More specifically, the controller 104 is configured to provide an inductor charge mode, a positive boost mode, a negative boost mode, and at least one rest state. For the inductor charge mode, the controller 104 is configured to close S1 and S4 and to open S2 and S3. For the positive boost mode, the controller 104 is configured to close S1 and S3 and to open S2 and S4. For the negative boost mode, the controller 104 is configured to close S2 and S4 and to open S1 and S3. In one example rest state, the controller 104 is configured to close S1 and to open S2, S3, and S4. In another example rest state, the controller 104 is configured to close S4 and to open S1, S2, and S3.

In some examples, the controller 104 comprises an asynchronous state machine configured to adjust control signals (CS1-CS4) for S1-S4 of the SIMO converter circuit 102 to achieve the various modes or rest states described herein without a clock signal. More specifically, in the example of FIG. 1, the controller 104 receives various input signals from the sense circuit 108 and adjusts the operations of S1-S4 to achieve the various modes or rest states described herein In some examples, the controller 104 performs a state machine cycle that includes starting at one of the first or second rest states. The state machine cycle also includes performing at least one boost iteration that includes the inductor charge mode and the positive or negative boost mode. The state machine cycle also includes returning to one of the first or second rest states. In some examples, the controller 104 includes arbitration logic (see e.g., the arbitration logic 240 in FIG. 2) configured to determine whether the positive boost mode or the negative boost mode is used in a given boost iteration. In some examples, the arbitration logic uses sense signals from the sense circuit 108 to determine whether the positive boost mode or the negative boost mode is used in a given boost iteration.

Once a boost iteration is triggered, the controller 104 performs an inductor charge mode by closing S1 and S4 while S2 and S3 are open. In some examples, the inductor charge mode continues until the inductor charge is above a programmable threshold. After the inductor charge mode is complete, the controller 104 transitions to the positive boost mode or the negative boost mode depending on arbitration results (e.g., which output supply voltage is farthest from a respective target and/or other criteria). After a positive or negative boost mode is complete, the controller 104 transitions to another boost iteration or to one of the rest states depending on the input signals to the controller 104.

In the example of FIG. 1, the system 100 includes a current monitor circuit 130 coupled to the LY node 122 and/or the LX node 124. As shown, the current monitor circuit 130 includes an "on" detect circuit 131, a current estimation circuit 132, and a compare circuit 134. In operation, the "on" detect circuit 131 detects a switch "on" condition. In some examples, when the SIMO converter circuit 102 transitions from an inductor charge mode to a negative boost mode, "the on" detect circuit 131 detects that S2 is closed. On the other hand, when the SIMO converter circuit 102 transitions from an inductor charge mode to a positive boost mode, the "on" detect circuit 131 detects that S3 is closed.

The current estimation circuit 132 determines an estimate of the current to the positive output supply node 116 during a positive boost mode and/or the current to the negative output supply node 114 during a negative boost mode. In some examples, the estimated current corresponds to a voltage value. As shown, the current monitor circuit 132 also comprises a compare circuit 134. The compare circuit 134 compares a current estimate 133 output from the current estimation circuit 132 with a programmable threshold 138. If the current estimate 133 is greater than the programmable threshold 138, the compare circuit 134 outputs an overcurrent signal or alert signal 136. In other examples, the compare stage 134 outputs an undercurrent signal in response to the current estimate 133 being equal to or less than the programmable threshold 138. In some examples, the compare stage 134 avoids outputting a signal in response to the current estimate being equal to or less than the reference value (i.e., the compare stage only outputs a signal in response to an overcurrent condition).

Figure 2:
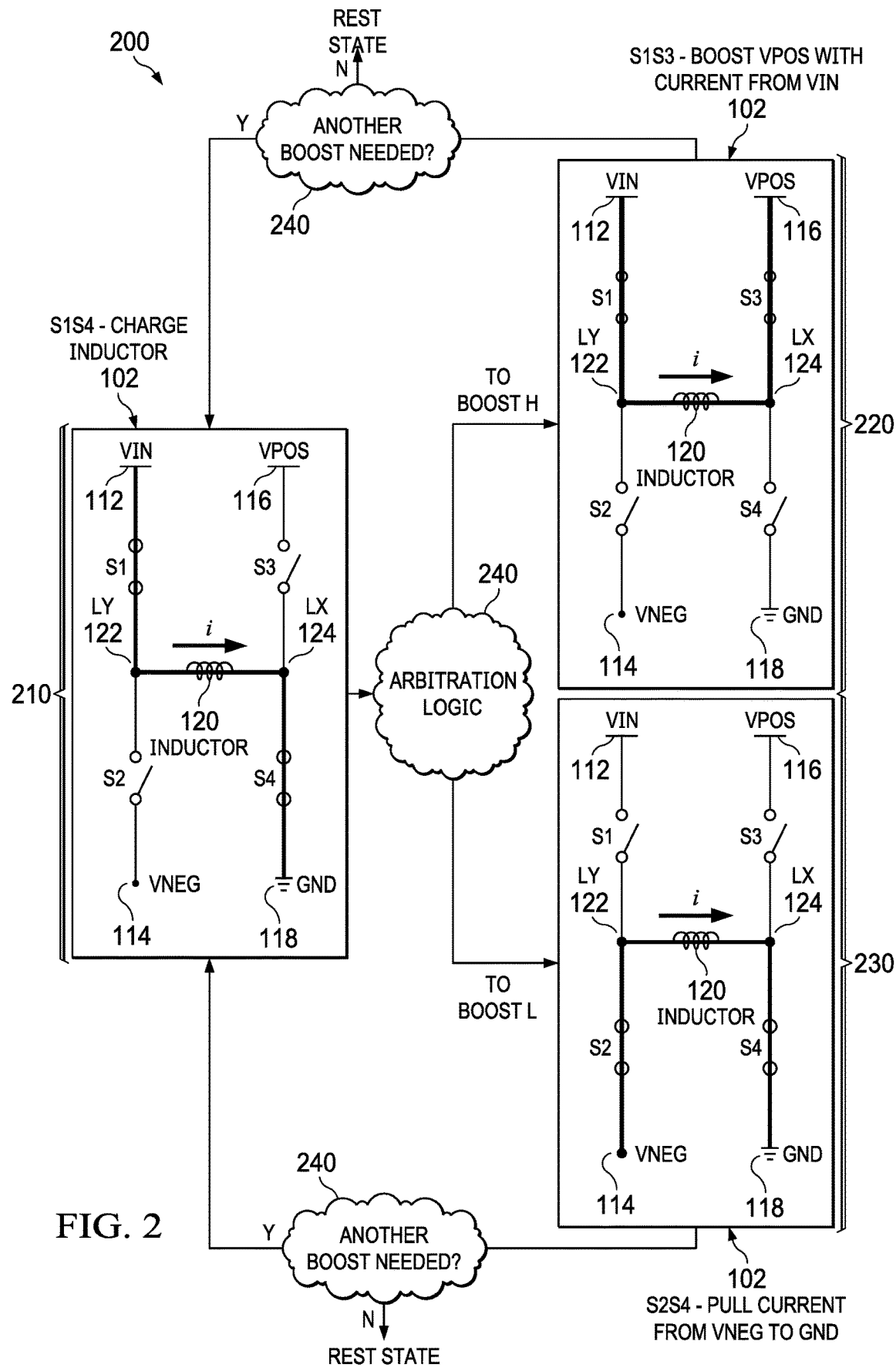
FIG. 2 is a set of schematic diagrams showing a boost iteration scenario in accordance with various examples.

FIG. 2 is a set of schematic diagrams showing a boost iteration scenario 200 in accordance with various examples. In scenario 200, a boost iteration is initiated by transitioning from a rest state (not shown) to an inductor charge mode arrangement 210 for the SIMO converter circuit 102. As shown in FIG. 2, the inductor charge mode arrangement 210 corresponds to S1 and S2 being closed while S2 and S3 are open. After the inductor charge mode is complete, arbitration logic 240 determines whether a positive boost or a negative boost will be performed.

In scenario 200, a positive boost is performed by transitioning from the inductor charge mode arrangement 210 for the SIMO converter circuit 102 to the positive boost arrangement 220 for the SIMO converter circuit 102. As shown, the positive boost mode arrangement 220 corresponds to S1 and S3 being closed while S2 and S4 are open. After the positive boost mode is complete, arbitration logic 240 determines whether another boost iteration is needed. If so, the scenario 200 returns to the inductor charge mode arrangement 210 for the SIMO converter circuit 102, and subsequently another positive or negative boost. Otherwise, if another boost iteration is not needed, the boost iteration scenario 200 is complete and the SIMO converter circuit 102 is placed in a rest state as described herein. In some examples, the use of the different rest states depends on enable signals (e.g., VPOS_enabled and/or S1_IDLE) as described herein.

In scenario 200, a negative boost is performed by transitioning from the inductor charge mode arrangement 210 for the SIMO converter circuit 102 to the negative boost arrangement 230 for the SIMO converter circuit 102. As shown, the negative boost mode arrangement 230 corresponds to S2 and S4 being closed while S1 and S3 are open. After the negative boost mode is complete, arbitration logic 240 determines whether another boost iteration is needed. If so, the scenario 200 returns to the inductor charge mode arrangement 210 for the SIMO converter circuit 102, and subsequently another positive or negative boost is performed. Otherwise, if another boost iteration is not needed, the boost iteration scenario 200 is complete and the SIMO converter circuit 102 is placed in a rest state.

In some scenarios, a current monitor circuit (e.g., the current monitor circuit 130 of FIG. 1) performs its operations during a positive boost mode (when the SIMO converter circuit 102 in is the positive boost arrangement 220). In other scenarios, a current monitor circuit (e.g., the current monitor circuit 130 of FIG. 1) performs its operations during a negative boost mode (when the SIMO converter circuit 102 in is the negative boost arrangement 220).

Figure 3:
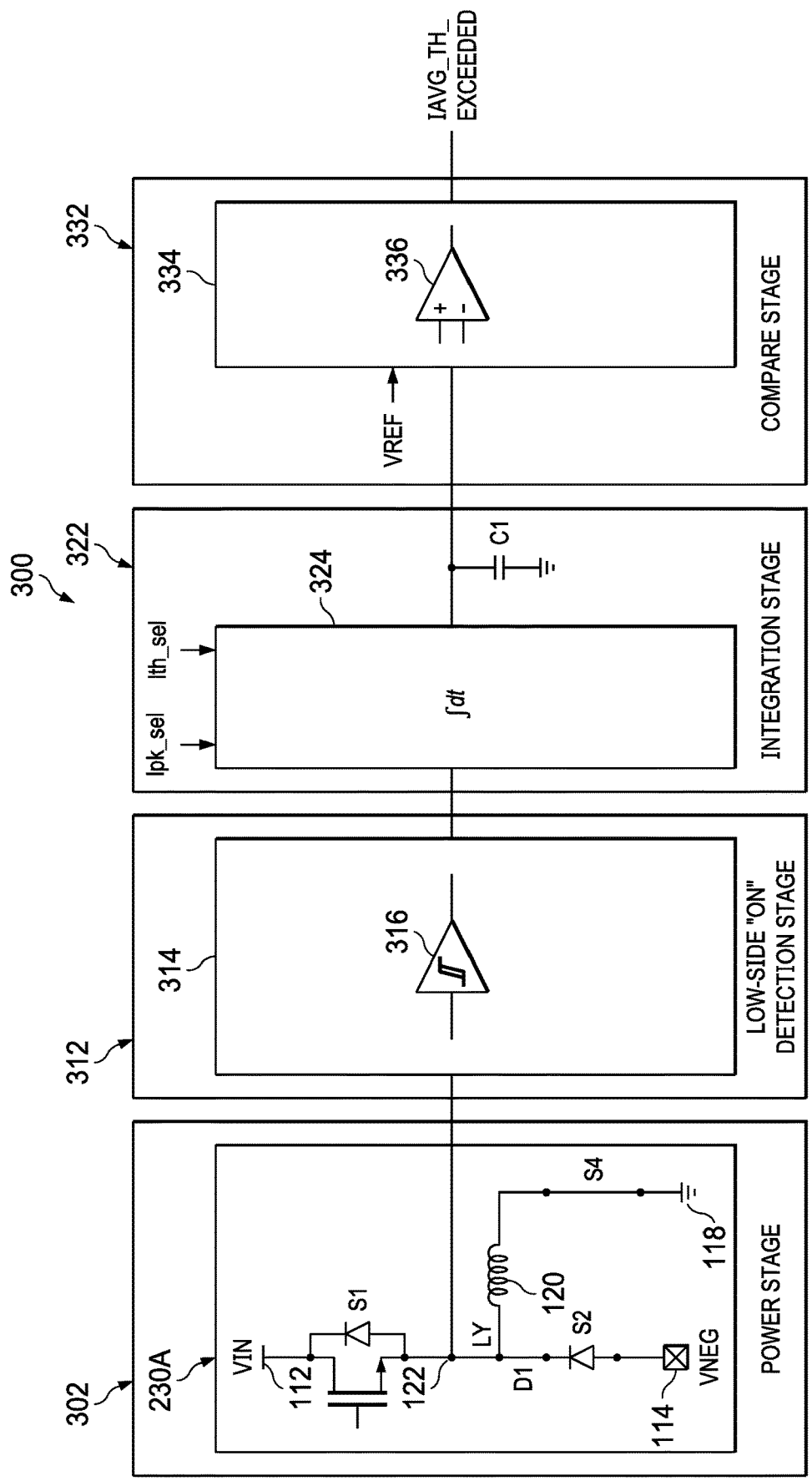
FIGS. 3-5 are block diagrams showing current monitoring circuits in accordance with various examples.
Figure 4:
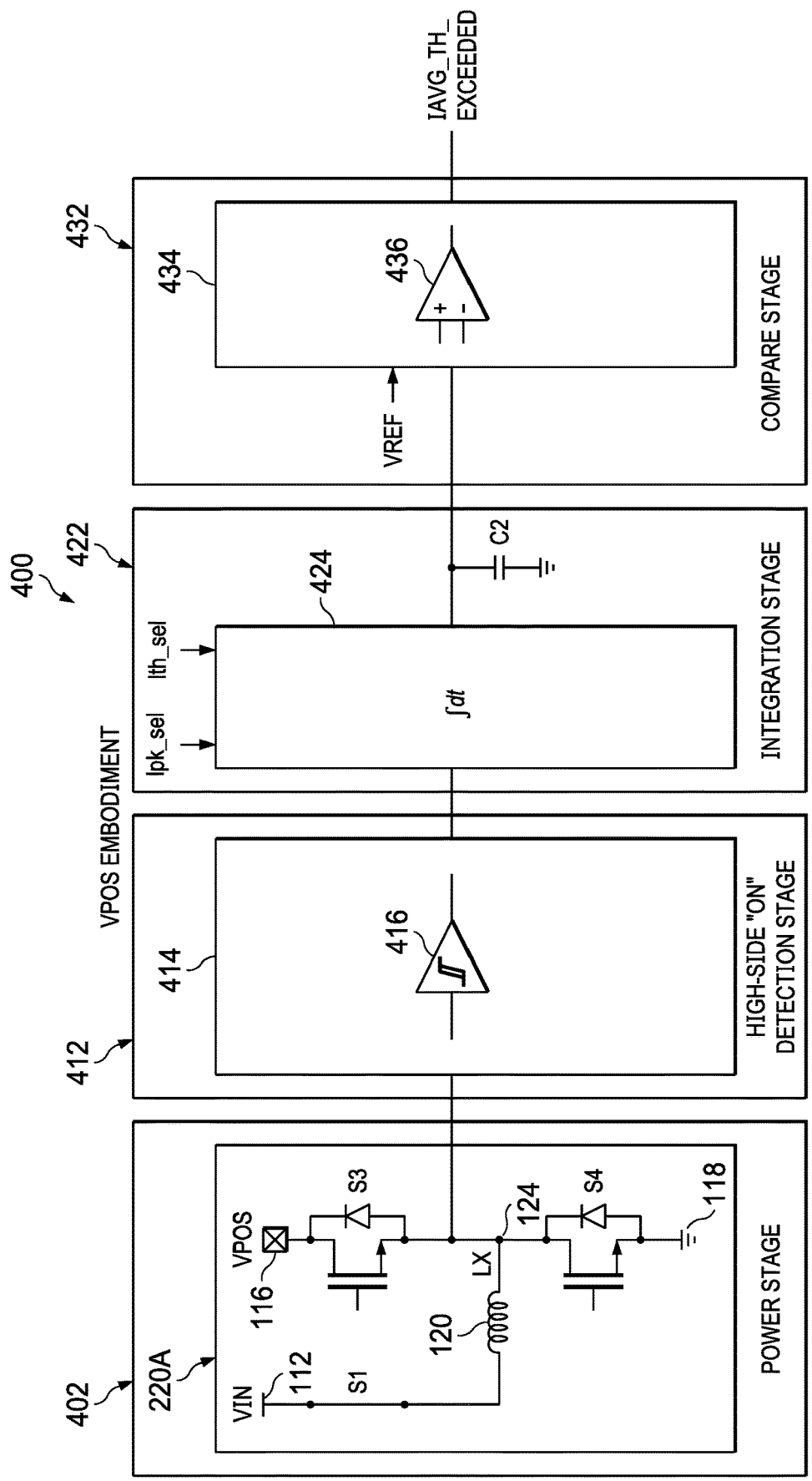
Figure 5:
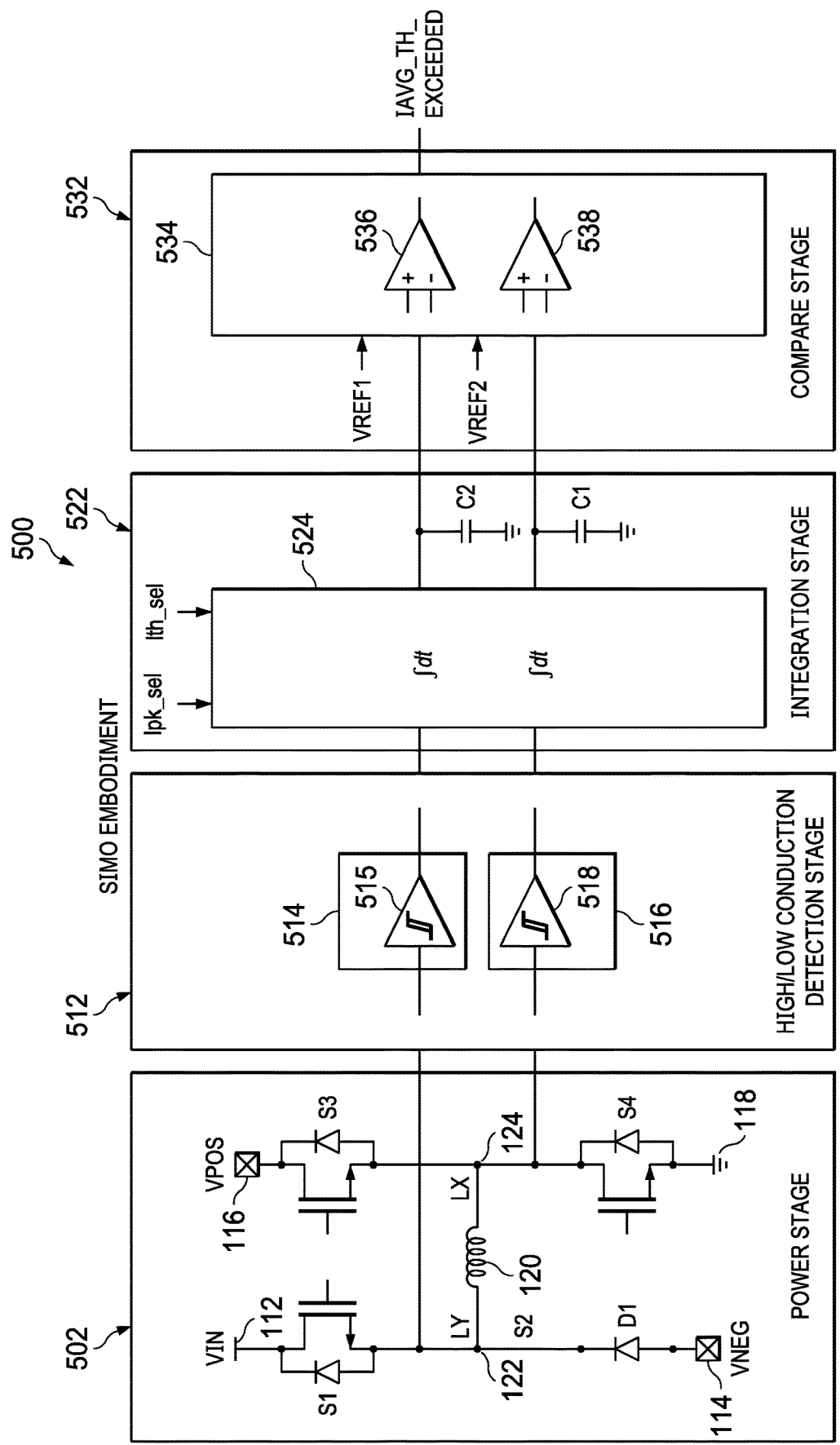

FIGS. 3-5 are block diagrams showing current monitoring circuits in accordance with various examples. In FIG. 3, a current monitoring circuit 300 for low-side monitoring (e.g., negative boost mode monitoring) is represented. As shown, the current monitoring circuit 300 includes a power stage 302, a low-side "on" detection stage 312, an integration stage 322, and a compare stage 332. The power stage 302 of FIG. 3 includes SIMO converter circuit components in a negative boost arrangement 230A. As shown, the negative boost arrangement 230A is represented in FIG. 3 using the supply voltage node 112, S1 open (where S1 corresponds to a transistor with a diode across its current terminals), the LY node 122, the inductor 120, the ground node 118, S2 closed (where S2 corresponds to a diode (D1) when closed), S4 closed, and the negative output supply node 114. Other components described for the SIMO converter circuit 102 may be present as well (e.g., S3, the LX node 124, and the positive output supply node 116), but are not represented in the negative boost arrangement 230A of FIG. 3.

In the example of FIG. 3, the low-side "on" detection stage 312 includes a detection circuit 314 coupled to the LY node 122. As shown, the detection circuit 314 includes a Schmitt trigger 316. During an inductor charge mode, S1 turns on and current flowing through the inductor 120 (from the VIN node 112 to the ground node 118) starts to increase. When sufficient current has built on the inductor 120, S1 is turned off causing current to steer from the transistor of S1 to the diode D1. As this event occurs, the voltage at the LY node 122 rapidly decreases below the voltage at the VNEG node 114, which causes D1 to turn on. Since the voltage at the LY node 122 decreases quickly, a capacitor (e.g., the capacitor 704 in FIG. 7) causes the input of the Schmitt trigger 316 to toggle. As the discharge cycle finishes and the inductor current reverses, the voltage at the LY node 122 increases above the voltage at the VNEG node 114 at a slower rate. As this happens, a capacitor (e.g., the capacitor 704 in FIG. 7) pushes charge on the input of the Schmitt trigger 316 and immediately toggles its state, even before the voltage at the LY node 122 increases all the way to the input supply voltage (VIN) provided at node 112. In some examples, the low-side "on" detection stage 312 can detect a switch "on" time with a very short duration (e.g., 20-100 ns).

As shown, the integration stage 322 includes an integration circuit 324 with a peak current value (e.g., the same value as the inductor charging phase threshold) and a current threshold value (Ith_sel). In some examples, the integration circuit 324 pushes a divided version of the estimated peak current into C1 whenever the low-side diode/switch (S2) is on. In some examples, the peak inductor charging current is programmable using a signal (Ipk_sel). Also, the integration circuit 324 calculates the average output current minus the threshold current. In this case, when the average output current exceeds the threshold current, the voltage of C1 increases. In another example, the integration circuit 324 calculates the average output current into a node voltage by charging C1 in parallel with an optional resistor. In some examples, the integration circuit 324 uses a known fraction, (e.g., $\alpha=\frac{1}{10000}$), of the peak inductor current setting. Since this current is programmable, a scaling factor is applied to match the programmed value. This arrangement effectively estimates the average output current of the converter by utilizing the peak inductor current setting and S2 "on" time information. The reason the current is estimated rather than measured is to avoid an ultra-high bandwidth, high quiescent current (Iq), large area, sense amp to precisely measure the current.

The compare stage 332 includes a compare circuit 334 with a comparator 336. The inputs to the comparator 336 are the C1 voltage from the integration stage 322 and a reference voltage (VREF). In response to the output of the integrator being above VREF, the compare circuit 334 outputs an overcurrent signal (IAVG_TH_EXCEEDED). In some examples, as in FIG. 3, the overcurrent signal is an indication that an average current estimate provided by the integration stage 322 exceeds a threshold. In some examples, the comparator 336 is used to detect when the current has exceeded the selected average current threshold, where the detection and filtering time can be chosen by the value of C1.

In FIG. 4, a current monitoring circuit 400 for high-side monitoring (e.g., positive boost mode monitoring) is represented. As shown, the current monitoring circuit 400 includes a power stage 402, a high-side "on" detection stage 412, an integration stage 422, and a compare stage 432. The power stage 402 of FIG. 4 includes SIMO converter circuit components in a positive boost arrangement 220A. In other examples, a positive-only switching converter may include only S3 and S4. As shown, the positive boost arrangement 220A is represented in FIG. 4 using the supply voltage node 112, S1 closed (or replaced by a short) (e.g., S1 corresponds to a transistor with a diode across its current terminals), the LX node 124, the inductor 120, the ground node 118, S3 closed (in the form of a transistor with a diode across its current terminals), S4 open (in the form of a transistor with a diode across its current terminals). Other components described for the SIMO converter circuit 102 may be present as well (e.g., S2 the LY node 122, and the negative output supply node 114), but are not represented in the positive boost arrangement 220A of FIG. 4.

In the example of FIG. 4, the high-side "on" detection stage 412 includes a detection circuit 414 coupled to the LX node 124. As shown, the detection circuit 414 includes a Schmitt trigger 416. During an inductor charge mode, S4 turns on and current flowing through the inductor 120 (from the VIN node 112 to the ground node 118) starts to increase. When sufficient current has built on the inductor 120, S4 is opened and S3 is closed causing current to flow to the positive output supply node 116. As this event occurs, the inductor 120 discharges and the voltage at the LX node 124 rapidly increases. Since the voltage at the LX node 124 increases quickly, C2 in FIG. 4 causes the input of the Schmitt trigger 416 to toggle. As the discharge cycle finishes, the inductor current reverses and the voltage at the LX node 124 decreases at a slower rate. As this happens, a capacitor (e.g., the capacitor 704 in FIG. 7) pushes charge on the input of the Schmitt trigger 416 and immediately toggles its state. In some examples, the high-side "on" detection stage 412 can detect a switch "on" time with a very short duration (e.g., 20-100 ns).

As shown, the integration stage 422 includes an integration circuit 424 with a peak current value (e.g., the same value as the inductor charging phase threshold) and a current threshold value (Ith_sel). In some examples, the integration circuit 424 pushes a divided version of the estimated peak current into C2 whenever the high-side diode (part of S1) in on. In some examples, the peak current is programmable using a signal (Ipk_sel). Also, the integration circuit 424 calculates the average output current minus the threshold current. In this case, when the average output current exceeds the threshold current, the voltage of C2 increases. In another example, the integration circuit 424 calculates the average output current into a node voltage by charging C2 in parallel with an optional resistor. In some examples, the integration circuit 424 uses a known fraction, (e.g., $\alpha=\frac{1}{10000}$), of the estimated peak inductor current. Since this current is programmable, a scaling factor is applied to match the programmed value. The reason the current is estimated rather than measured is to avoid an ultra-high bandwidth, high quiescent current (Iq), large area, sense amp to precisely measure the current.

The compare stage 432 includes a compare circuit 434 with a comparator 436. The inputs to the comparator 436 are the current estimate output from the integration stage 422 and a reference voltage (VREF). In response to the current estimate being above VREF, the compare circuit 434 outputs an overcurrent signal (IAVG_TH_EXCEEDED). In some examples, as in FIG. 4, the overcurrent signal is an indication that an average current estimate provided by the integration stage 422 exceeds a threshold. In some examples, the comparator 436 is used to detect when the current has exceeded the selected average current threshold, where the detection and filtering time can be chosen by the value of C2.

In FIG. 5, a current monitoring circuit 500 for high-side monitoring or low-side monitoring (e.g., positive boost mode monitoring and negative boost mode monitoring) is represented. As shown, the current monitoring circuit 500 includes a power stage 502, an "on" detection stage 512, an integration stage 522, and a compare stage 532. The power stage 502 of FIG. 5 includes SIMO converter circuit components. In a positive boost mode, S1 and S3 are closed, while S2 and S4 are open. In a negative boost mode, S2 and S4 is closed, while S1 and S3 are open. Also represented in the power stage 502 are the inductor 120, the LY node 122, the LX node 124, the power supply node 112, D1, the negative output power supply node 114, the positive output power supply node 116, and the ground node 118. In other examples, the components included in the power stage 502 may vary.

In the example of FIG. 5, the "on" detection stage 512 includes a first detection circuit 514 coupled to the LY node 122. As shown, the first detection circuit 514 includes a Schmitt trigger 515. The first detection circuit 514 operates is much the same manner as the detection circuit 314 described for FIG. 3. The "on" detection stage 512 also includes a second detection circuit 516 coupled to the LX node 122. As shown, the second detection circuit 516 includes a Schmitt trigger 518. The second detection circuit 514 operates is much the same manner as the detection circuit 414 described for FIG. 4.

As shown, the integration stage 522 includes an integration circuit 524 with a peak current value and a current threshold value (Ith_sel). In some examples, the integration circuit 524 pushes a divided version of the estimated peak current into C1 or C2. In some examples, the peak current is programmable using a signal (Ipk_sel).

The compare stage 532 includes a compare circuit 534 with a first comparator 536 and a second comparator 538. The inputs to the first comparator 536 (when used) are the current estimate output from the integration stage 522 to C2 and a first reference voltage (VREF1). In response to the current estimate from the integration stage 522 being above VREF1, the compare circuit 534 outputs an overcurrent signal (IAVG_TH_EXCEEDED). The inputs to the second comparator 538 (when used) are the current estimate output from the integration stage 522 to C1 and a second reference voltage (VREF2). In response to the current estimate from the integration stage 522 being above VREF2, the compare circuit 534 outputs IAVG_TH_EXCEEDED. In some examples, as in FIG. 5, the overcurrent signal is an indication that an average current estimate provided by the integration stage 522 exceeds a threshold.

Figure 6:
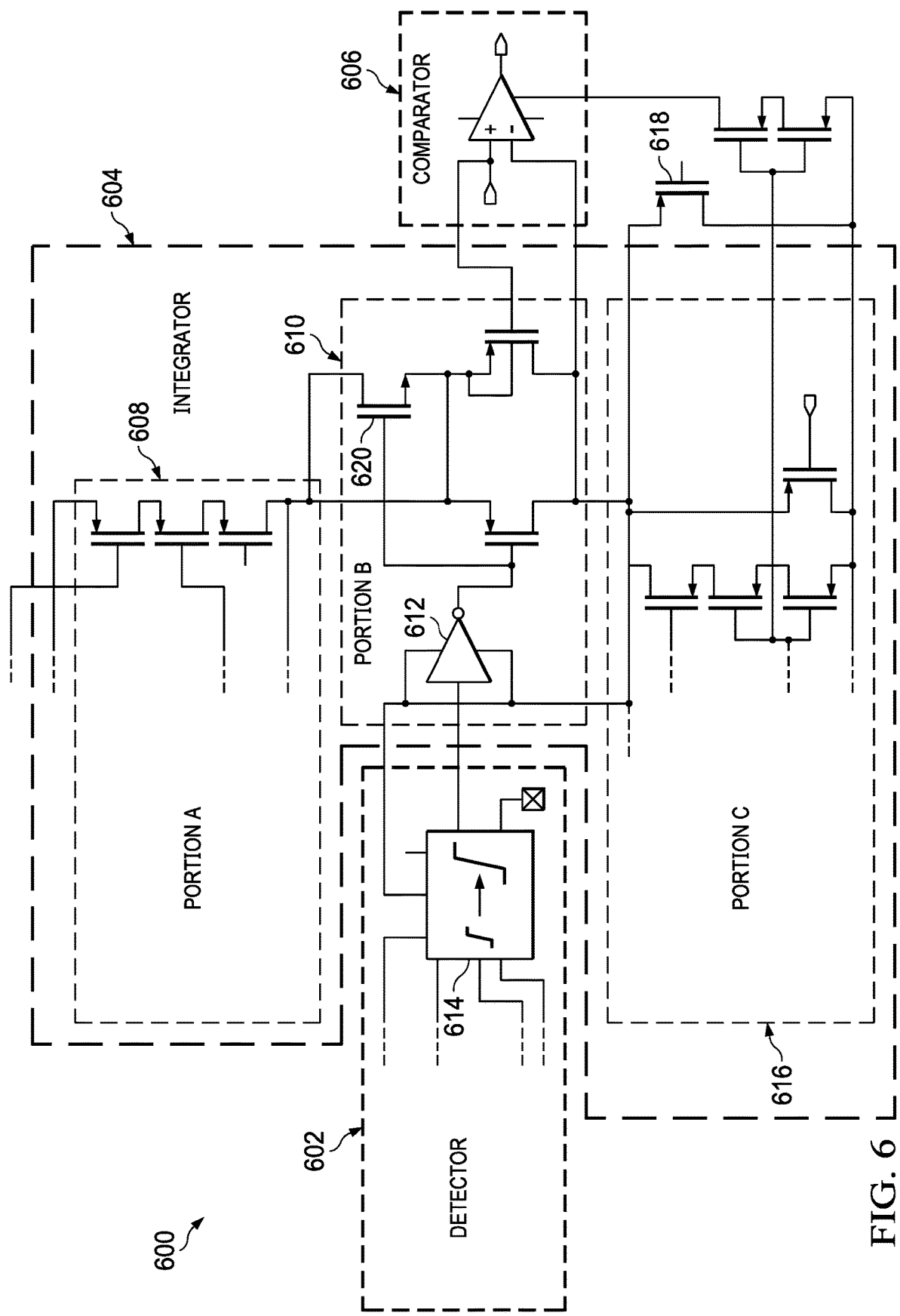
FIGS. 6 and 7 are schematic diagram showing current monitoring circuits in accordance with various examples.
Figure 7:
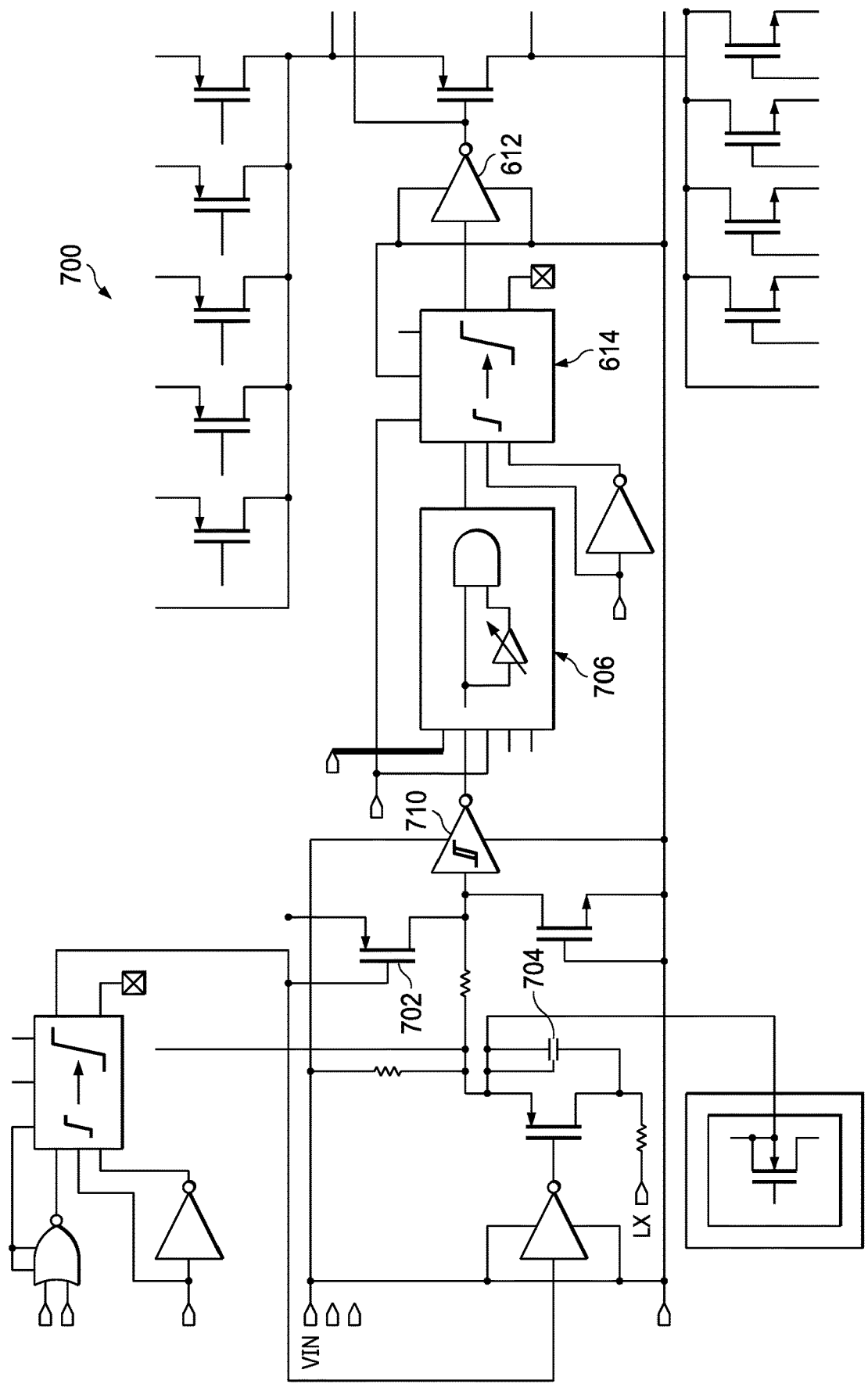

FIGS. 6 and 7 are schematic diagram showing current monitoring circuits 600 and 700 in accordance with various examples. In FIG. 6, the current monitoring circuit 600 includes a detector circuit 602, an integrator circuit 604, and a comparator 606. More specifically, the integrator circuit 604 includes a first current digital-to-analog converter (DAC) 612, a second current DAC 608, and a reset device 610. The first current DAC 612 modulates the current replica as the peak current changes. The second current DAC 608 sets the average current target threshold. The reset device 610 zeroes out the integrator circuit 604.

In FIG. 7, the current monitoring circuit 700 includes a transistor 702, a capacitor 704, and a Schmitt trigger 710. The current monitoring circuit 700 also includes circuits 706 and 708. In the current monitoring circuit 700, the transistor 702 and the capacitor 704 are part of an "on" detection circuit (see e.g., the "on" detection circuit 314 in FIG. 3) where the input to the detector circuit is the LY node 122. Meanwhile, the circuit 706 is a "trim" circuit configured to align the rising and falling edge delays. In some examples, the characteristic delay difference is found via characterization and the best fit number is used for all parts. Also, the circuit 708 is a level translator configured to convert the signal to the integrator voltage domain.

The moment S1 (see e.g., FIG. 2) turns on for an inductor charge mode, inductor current flowing from a power supply node (e.g., the power supply node 112 in FIG. 1) to a ground node (e.g., the ground node 118 in FIG. 1) starts to increase. When sufficient current has built on the inductor, S1 turns off, which causes current to steer from the transistor of S1 to the parasitic capacitance at the LY node 122. As this event occurs, the LY node 122 voltage rapidly decreases below the voltage of a negative output supply node (e.g., the negative output supply node 114 in FIG. 1) and causes a diode of S2 (see e.g., D1 in FIG. 3) to turn on. Since the voltage of the LY node 122 decreases quickly, the capacitor 704 below causes the input of the Schmitt trigger 710 to toggle. In the example of FIG. 7, a low Vt NMOS device adjacent to Schmitt trigger 710 keeps the input of the Schmitt trigger 710 from going much below ground. As the discharge cycle finishes and the inductor current reverses, the LY node 122 increases above the voltage at the negative output supply node 114 at a slower rate. As this happens, the capacitor 704 pushes charge on the input of the Schmitt trigger 710, causing its input voltage to increase from close to 0V to Vin, immediately toggling its state even before voltage at the LY node 122 increases all the way to the voltage at the power supply node 112.

Figure 8:
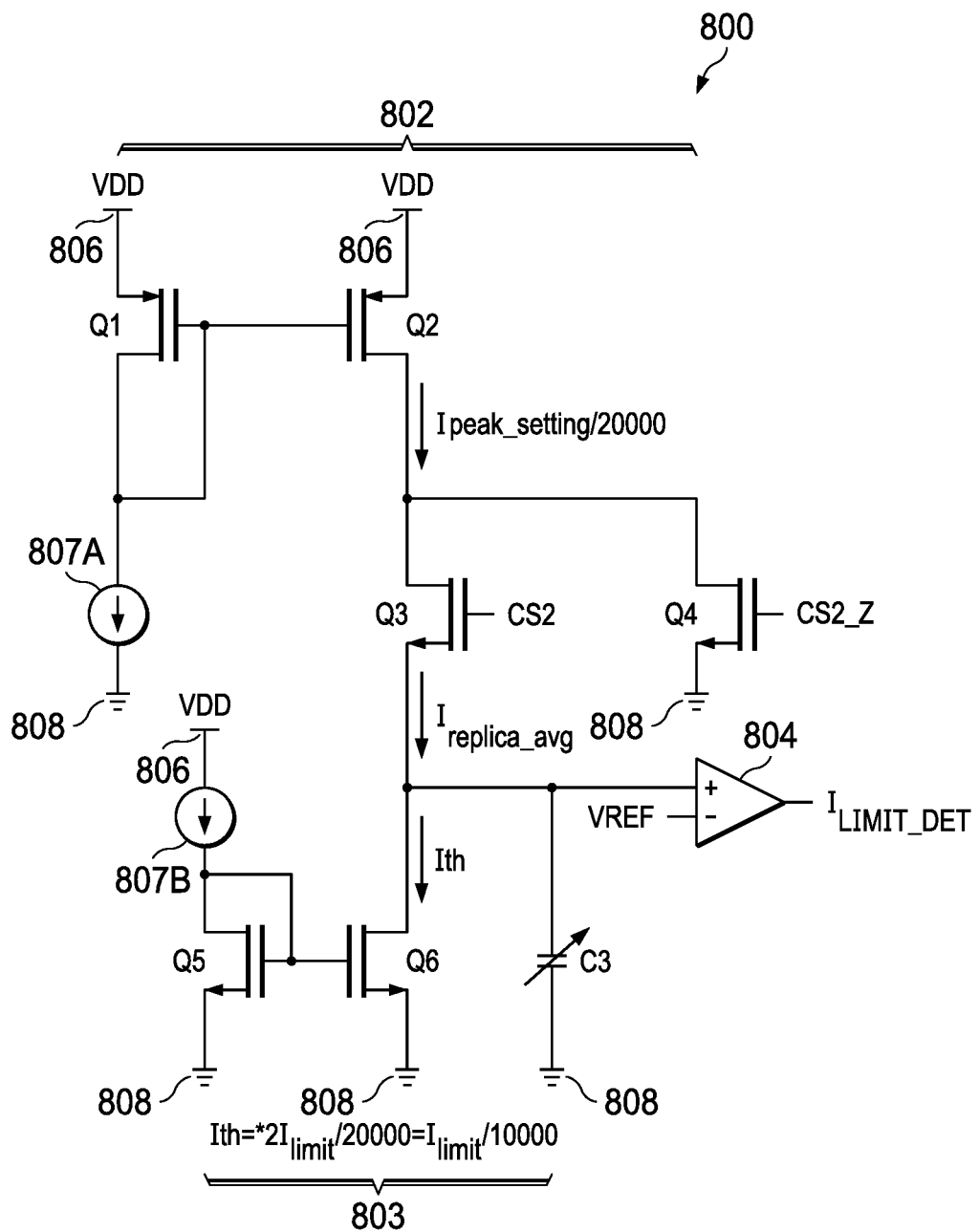
FIG. 8 is a schematic diagram of part of a current monitoring circuit in accordance with various examples.

FIG. 8 is a schematic diagram 800 of part of a current monitoring circuit 802 in accordance with various examples. As shown, the current monitoring circuit 802 includes an integration circuit 803 and a comparator 804. More specifically, the integration circuit 803 includes a plurality of transistors, Q1-Q6, each having a first current terminal, a second current terminal, and a control terminal. The first current terminals of Q1 and Q2 are coupled to a power supply node 806. The control terminals of Q1 and Q2 are coupled to each other. The second current terminal of Q1 is coupled to the control terminal of Q1 and to a first current source 807A, where the first current source 807A is between the second current terminal of Q1 and a ground node 808. In the example of FIG. 8, the current through Q2 corresponds to peak current setting divided by 20000 (I_peak_setting/20000). In different examples, the peak current setting and/or scaling of the peak current setting varies. The second current terminal of Q2 is coupled to the first current terminals of Q3 and Q4. The control terminal of Q3 is directed by a clock signal (CS2), and the control terminal of Q4 is directed by another clock signal (CS2_Z, where CS2_Z is the inverse of CS2). In some examples, CS2 also directs S2 (e.g., the switch to the negative output supply node 114 in FIG. 1). In other examples, a detector (e.g., the detection circuit 314 in FIG. 3) may be used to drive CS2 and CS2_Z. The second current terminal of Q4 is coupled to the ground node 808.

The second current terminal of Q3 is coupled to the first current terminal of Q6 and to one of the inputs of the comparator 804. In some examples, as in FIG. 8, the current at the second current terminal of Q3 is an average estimated current ($I_{replica\_avg}$). As shown, the second current terminal of Q6 is coupled to the ground node 808. Meanwhile, the control terminal of Q6 is coupled to the control terminal of Q5 and to a current source 807B. More specifically, the current source 807B is between the power supply node 806 and the control terminals of Q5 and Q6. As shown, the control terminal of Q5 is also coupled to the first current terminal of Q5. Finally, the second current terminal of Q5 is coupled to the ground node 808. In the example of FIG. 8, the current through Q6 is a threshold current (Ith), where Ith=$2*I_{limit}/20000$=$I_{limit}/10000$.

In the example of FIG. 8, the second current terminal of Q3 is also coupled to the top plate of a variable capacitor, C3. The bottom plate of C3 is coupled to the ground node 808. In the example of FIG. 8, C3 has a value of 50 pF. In operation, the difference between $I_{replica\_avg}$ and Ith causes charge to build up at C3, to provide a voltage value to the comparator 804, where an increasing voltage is a representation of the average output current exceeding a desired converter output threshold value. The other input to the comparator 804 is a reference voltage (VREF), which does not need to be precise. The output of the comparator 804 is a value $I_{limit\_det}$, where $I_{limit\_det}$ corresponds to IAVG_TH_EXCEEDED in FIGS. 3-5.

Figure 9:
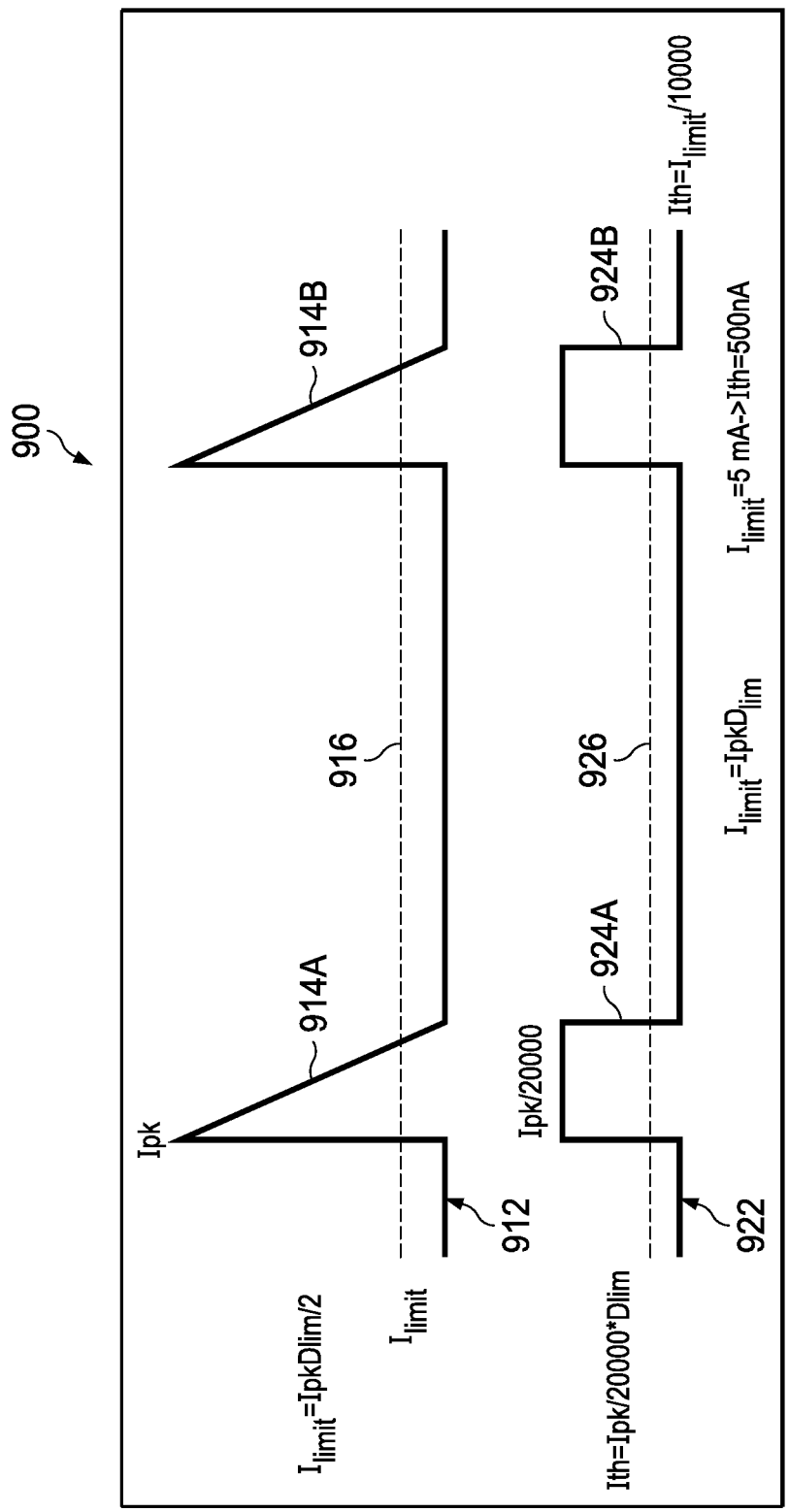
FIG. 9 is a timing diagram showing current waveform and an estimated current waveform as a function of time in accordance with various examples.

FIG. 9 is a timing diagram 900 showing a current waveform 912 and an estimated current waveform 922 as a function of time in accordance with various examples. As shown, the current waveform 912 includes pulses 914A and 914B, where the average current of the current waveform 912 is $I_{limit}$ 916. In the example of FIG. 9, $I_{limit}=I_{pk}D_{lim}/2$, where $I_{pk}$ is the peak current and $D_{lim}$ is the duty cycle (or the mathematical expression $t_{S2}/(t_{S2}+t_{S1,S4})$, where ts2 is the amount of time where only S2 is on). In the example of FIG. 9, the estimated current waveform 922 has pulses 924A and 924B, where the average current of the estimated current waveform 922 is Ith 926. In different examples, choosing pulses of Ipk/20000 results in Ith=$I_{pk}/20000*D_{lim}$, or $I_{limit}/10000$. Example values for $I_{limit}$ and Ith are: ILIM=5 mA; and Ith=500 nA. Note: in the current estimator examples described herein, the estimator assumes an output current with a triangular shape. This is the case for a switching converter since the inductor behavior follows the equation: V=L*di/dt. For a constant V and L, di/dt is constant (e.g. the inductor current is linearly decreasing). Meanwhile, the estimated current waveform includes square shapes since switches can switch a constant current with ease in a circuit implementation.

In this description, the term "couple" or "couples" means either an indirect or direct wired or wireless connection. Thus, if a first device couples to a second device, that connection may be through a direct connection or through an indirect connection via other devices and connections. Also, in this description, the recitation "based on" means "based at least in part on." Therefore, if X is based on Y, then X may be a function of Y and any number of other factors.

Modifications are possible in the described embodiments, and other embodiments are possible, within the scope of the claims.

What is claimed is:

1. A system, comprising:
   a switching converter circuit; and
   a monitoring circuit coupled to the switching converter circuit, the monitoring circuit comprising:

a current estimation circuit configured to estimate an output current of the switching converter circuit; and a compare circuit configured to: compare the estimated output current with a threshold; and output an alert signal responsive to the estimated output current being greater than the threshold.

2. The system of claim 1, wherein the threshold is adjustable.

3. The system of claim 2, wherein the threshold is adjustable between 3-13 mA.

4. The system of claim 1, wherein the current estimation circuit comprises an integrator.

5. The system of claim 4, wherein the integrator includes a current digital-to-analog converter (DAC) configured to modulate a current replica based on a peak current.

6. The system of claim 5, wherein the current DAC is a first current DAC, and the integrator comprises a second current DAC configured to set an average current target threshold.

7. The system of claim 4, wherein the integrator comprises a reset device configured to zero out the integrator.

8. The system of claim 1, wherein the current estimation circuit is configured to detect a high-side switch on time between 20-100 nanoseconds.

9. The system of claim 4, wherein the integrator is configured to apply a scaling to an estimated peak inductor current, and the scaling is less than $1/10000$.

10. The system of claim 1, wherein the switching converter circuit comprises a negative supply output, and the current estimation circuit is configured to estimate the output current by estimating an average output current at the negative supply output.

11. The system of claim 1, wherein the switching converter circuit comprises a positive supply output, and the current estimation circuit is configured to estimate the output current by estimating an average output current at the positive supply output.

12. A converter circuit, comprising:
a first switch coupled between a first inductor terminal and a voltage supply terminal;
a second switch coupled between the first inductor terminal and a negative supply output;
a third switch coupled between a second inductor terminal and a positive supply output;
a fourth switch coupled between the second inductor terminal and a ground terminal;
a controller coupled to the first, second, third and fourth switches; and
a monitoring circuit coupled to at least one of the negative supply output or the positive supply output, the monitoring circuit comprising:
a current estimation circuit; and
a compare circuit coupled to the current estimation circuit.

13. The converter circuit of claim 12, wherein the current estimation circuit is configured to estimate an output current of the converter circuit, and the compare circuit is configured to: compare the estimated output current with a threshold; and output an alert signal responsive to the estimated output current being greater than the threshold.

14. The converter circuit of claim 13, wherein the threshold is adjustable between 3-13 mA.

15. The converter circuit of claim 12, wherein the current estimation circuit comprises an integrator, and the integrator comprises:
a first current digital-to-analog converter (DAC) configured to modulate a current replica based on a peak current; and
a second current DAC configured to set an average current target threshold.

16. The converter circuit of claim 12, wherein the current estimation circuit is configured to detect a high-side switch on time between 20-100 nanoseconds.

17. The converter circuit of claim 15, wherein the integrator is configured to apply a scaling to an estimated peak inductor current, and the scaling is less than $1/10000$.

18. A converter device, comprising:
a first switch coupled between a first inductor terminal and a voltage supply terminal;
a second switch coupled between the first inductor terminal and a negative supply output terminal;
a third switch coupled between a second inductor terminal and a positive output supply terminal;
a fourth switch coupled between the second inductor terminal and a ground terminal; and
a monitoring circuit coupled to at least one of the negative supply output or the positive supply output, in which the monitoring circuit is configured to estimate an output current and to provide an alert signal responsive to the estimated output current being greater than a threshold.

19. The converter device of claim 18, wherein the monitoring circuit comprises:
a current estimation circuit configured to estimate an average output current at the negative supply output; and
a compare circuit configured to compare the estimated average output current with the threshold, in which the compare circuit is configured to output an alert signal responsive to the estimated average output current being greater than the threshold.

20. The converter device of claim 18, wherein the monitoring circuit comprises:
a current estimation circuit configured to estimate an average output current at the positive supply output; and
a compare circuit configured to compare the estimated average output current with the threshold, in which the compare circuit is configured to output an alert signal responsive to the estimated average output current being greater than the threshold.

* * * * *